(12) United States Patent
Tseng et al.

(10) Patent No.: US 9,991,132 B2
(45) Date of Patent: Jun. 5, 2018

(54) LITHOGRAPHIC TECHNIQUE INCORPORATING VARIED PATTERN MATERIALS

(71) Applicant: Taiwan Semiconductor Manufacturing Company, Ltd., Hsin-Chu (TW)

(72) Inventors: Chin-Yuan Tseng, Hsin-Chu (TW); Chi-Cheng Hung, Miaoli County (TW); Chun-Kuang Chen, Hsinchu County (TW); De-Fang Chen, Hsinchu (TW); Ru-Gun Liu, Hsinchu County (TW); Tsai-Sheng Gau, HsinChu (TW); Wei-Liang Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/689,288

(22) Filed: Apr. 17, 2015

(65) Prior Publication Data

US 2016/0307769 A1    Oct. 20, 2016

(51) Int. Cl.
*H01L 21/00*    (2006.01)
*H01L 21/311*    (2006.01)
*H01L 21/033*    (2006.01)

(52) U.S. Cl.
CPC .... *H01L 21/31144* (2013.01); *H01L 21/0337* (2013.01)

(58) Field of Classification Search
CPC .................. H01L 29/66795; H01L 29/785
See application file for complete search history.

(56) References Cited

U.S. PATENT DOCUMENTS 8,039,179 B2    10/2011    Shieh et al.
8,202,681 B2    6/2012    Lin et al.
(Continued)

FOREIGN PATENT DOCUMENTS

KR    20120126442    11/2012
KR    20130005185    1/2013

OTHER PUBLICATIONS

Y. Chen, Q. Cheng, W. Kang, "Mandrel and spacer engineering based self-aligned triple patterning", Proc. of SPIE, vol. 8328, 83280O, 2012.
(Continued)

*Primary Examiner* — Zandra Smith
*Assistant Examiner* — Andre' C Stevenson
(74) *Attorney, Agent, or Firm* — Haynes and Boone, LLP

(57) ABSTRACT

A technique for patterning a workpiece such as an integrated circuit workpiece is provided. In an exemplary embodiment, the method includes receiving a workpiece having a material layer disposed on a substrate. A first set of fins is formed on the material layer, and a second set of fins is formed on the material layer interspersed between the first set of fins. The second set of fins have a different etchant sensitivity from the first set of fins. A first etching process is performed on the first set of fins and configured to avoid substantial etching of the second set of fins. A second etching process is performed on the second set of fins and configured to avoid substantial etching of the first set of fins. The material layer is etched to transfer a pattern defined by the first etching process and the second etching process.

20 Claims, 19 Drawing Sheets

(56) References Cited

U.S. PATENT DOCUMENTS

| | | |
|---|---|---|
| 8,518,836 B1 | 8/2013 | Tsai et al. |
| 8,524,605 B1 | 9/2013 | Chen |
| 8,563,410 B2 | 10/2013 | Lin et al. |
| 8,728,332 B2 | 5/2014 | Lin et al. |
| 8,741,776 B2 | 6/2014 | De et al. |
| 8,822,243 B2 | 9/2014 | Yan et al. |
| 8,850,369 B2 | 9/2014 | Lung et al. |
| 2006/0091468 A1 | 5/2006 | Liaw |
| 2009/0001045 A1 | 1/2009 | Chen et al. |
| 2010/0028809 A1 | 2/2010 | Vanleenhove et al. |
| 2011/0281208 A1 | 11/2011 | Lin et al. |
| 2012/0128935 A1 | 5/2012 | Dunn et al. |
| 2012/0278776 A1 | 11/2012 | Lei et al. |
| 2013/0210232 A1 | 8/2013 | De et al. |
| 2013/0273330 A1 | 10/2013 | Wang et al. |
| 2013/0295769 A1 | 11/2013 | Lin et al. |
| 2013/0320451 A1 | 12/2013 | Liu et al. |
| 2014/0154630 A1 | 6/2014 | Schmid et al. |
| 2014/0154887 A1 | 6/2014 | Trivedi et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0287614 A1* | 10/2015 | Cheng ............ H01L 21/823807 257/192 |
| 2016/0071771 A1* | 3/2016 | Colburn ............. H01L 21/3086 438/283 |
| 2016/0093502 A1* | 3/2016 | Cheng ................ H01L 21/3086 257/623 |

OTHER PUBLICATIONS

Third-Party IDS about TSMC Patent Application, Y. Chen, 2016.

\* cited by examiner

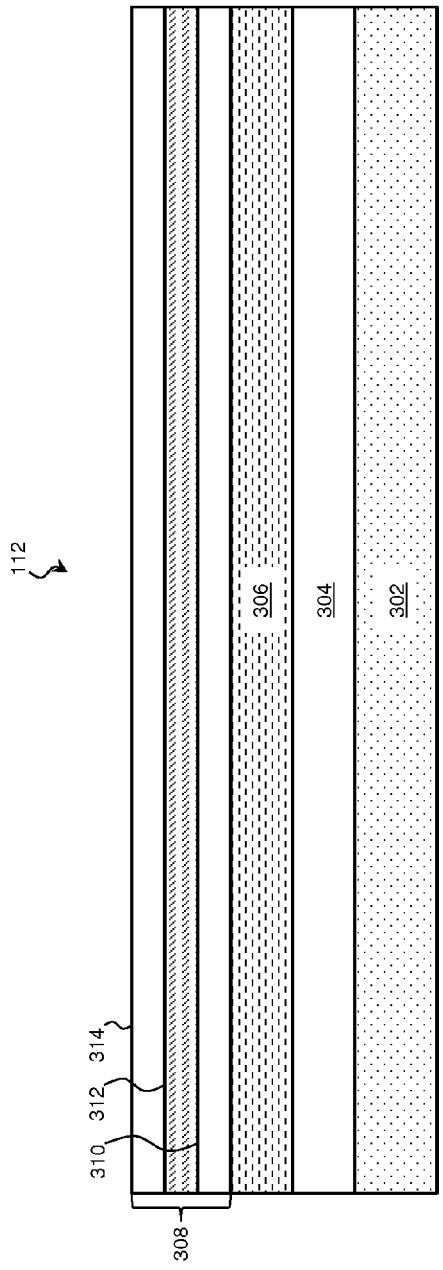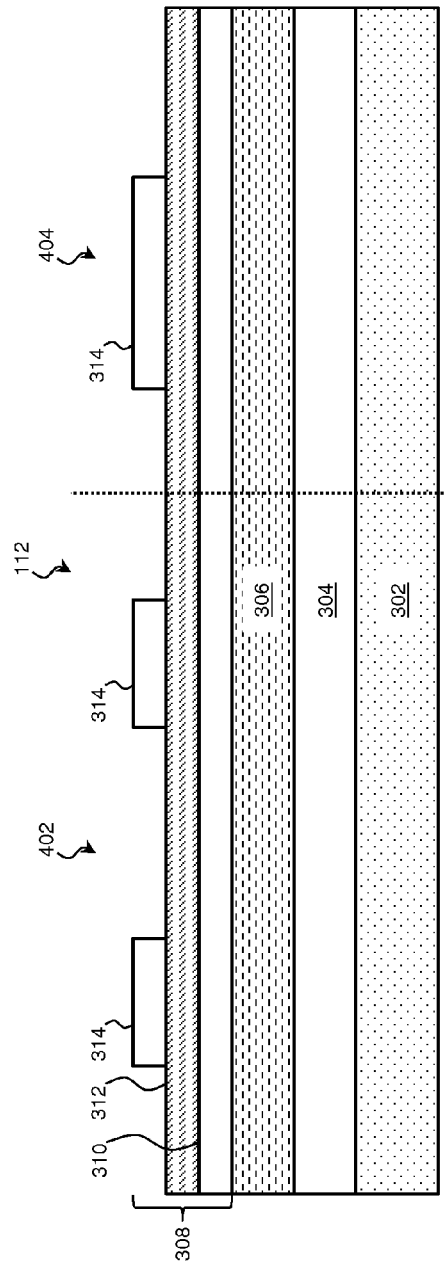

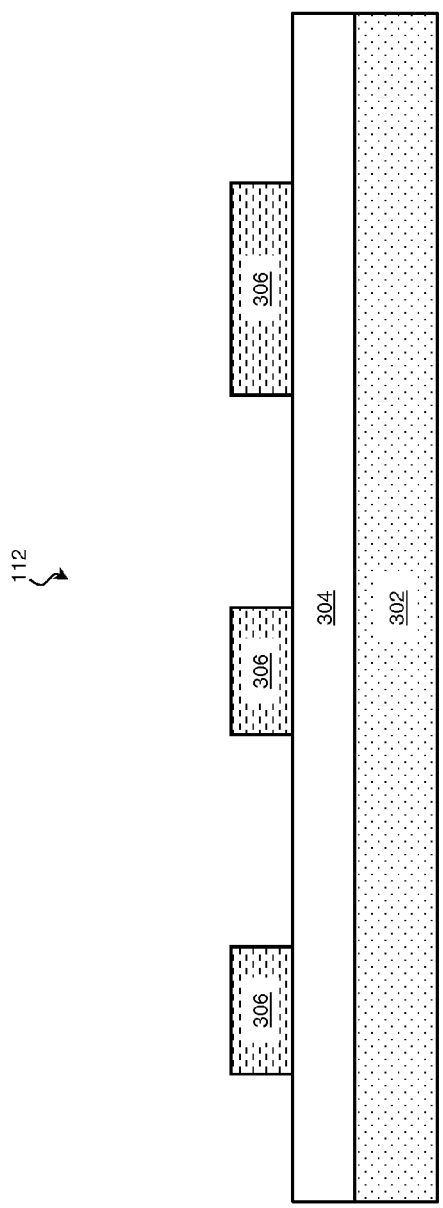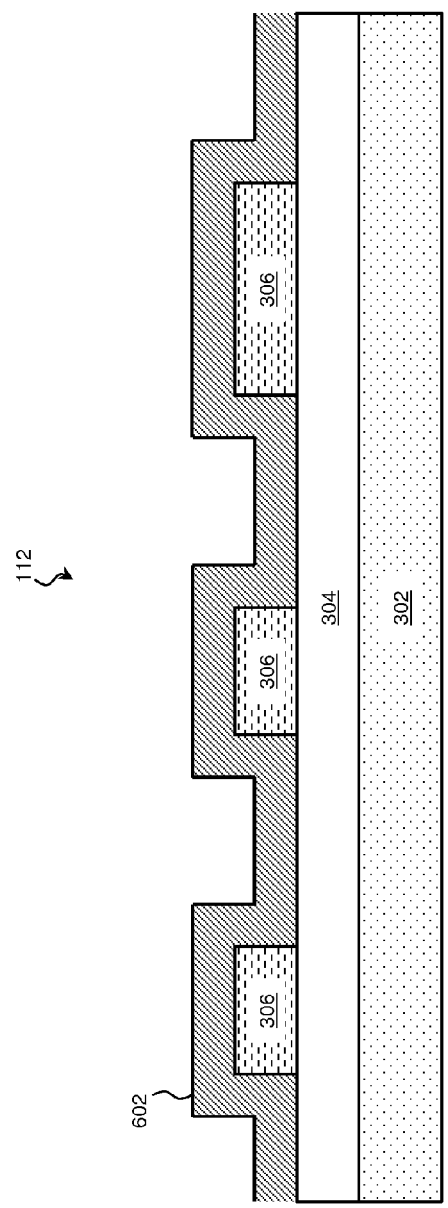

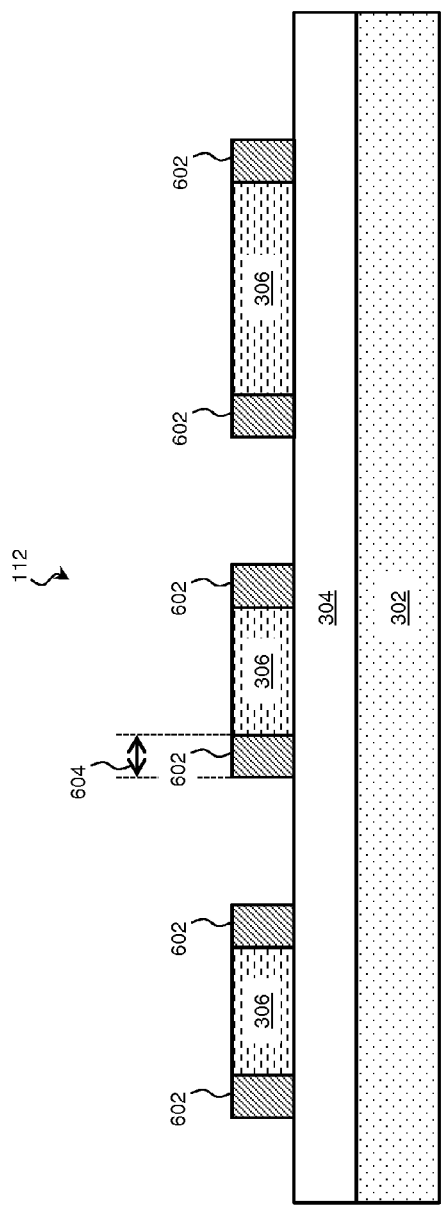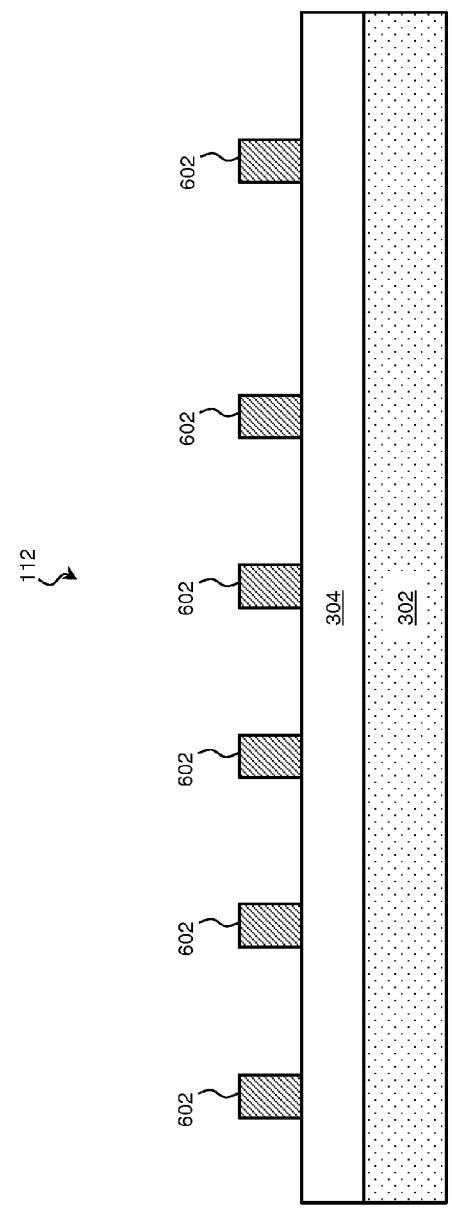

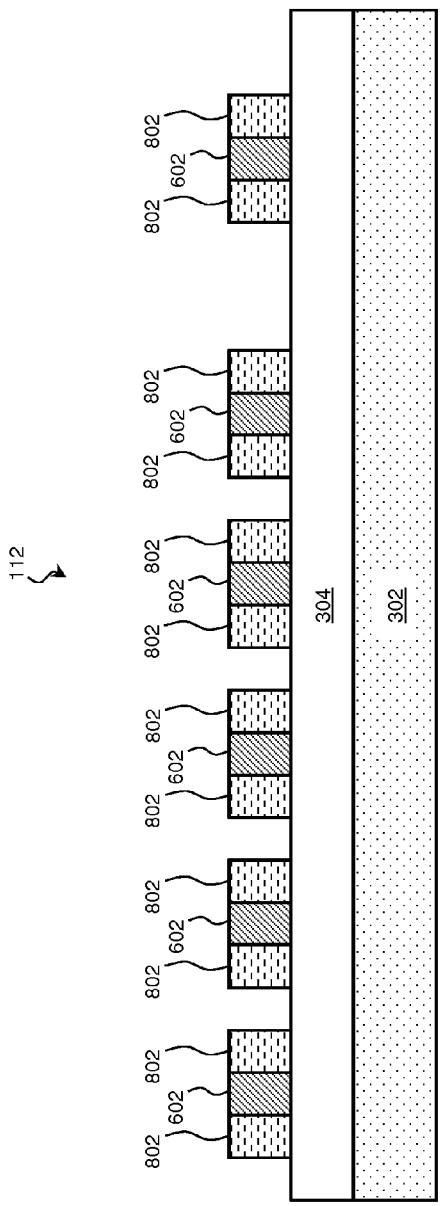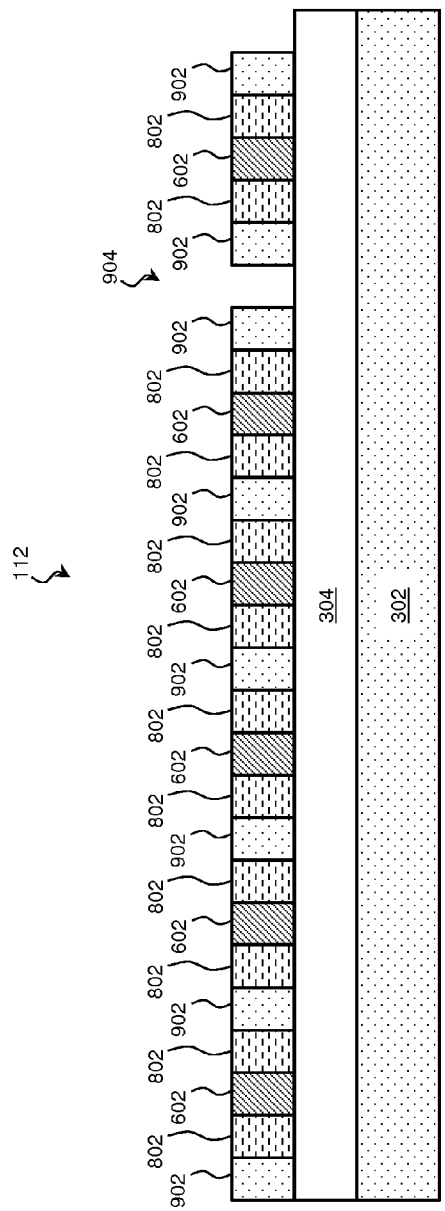

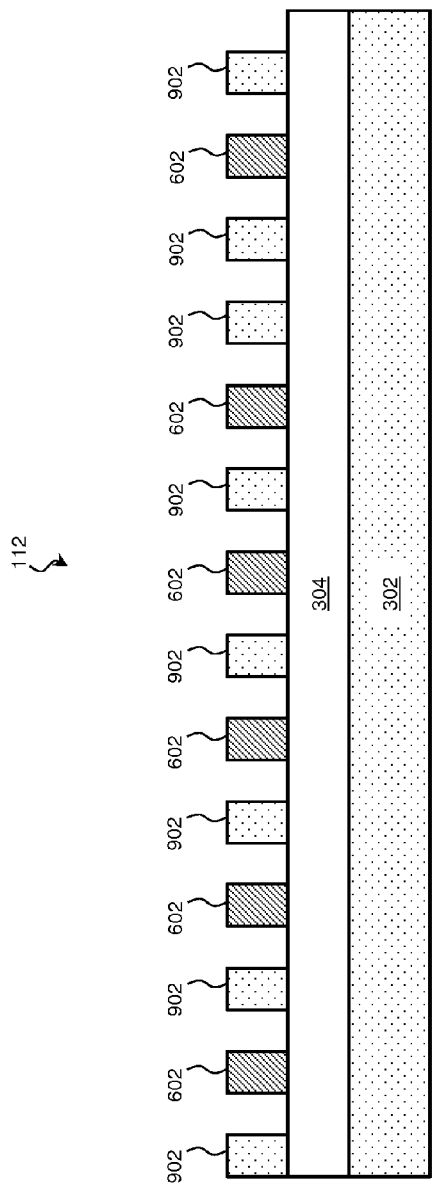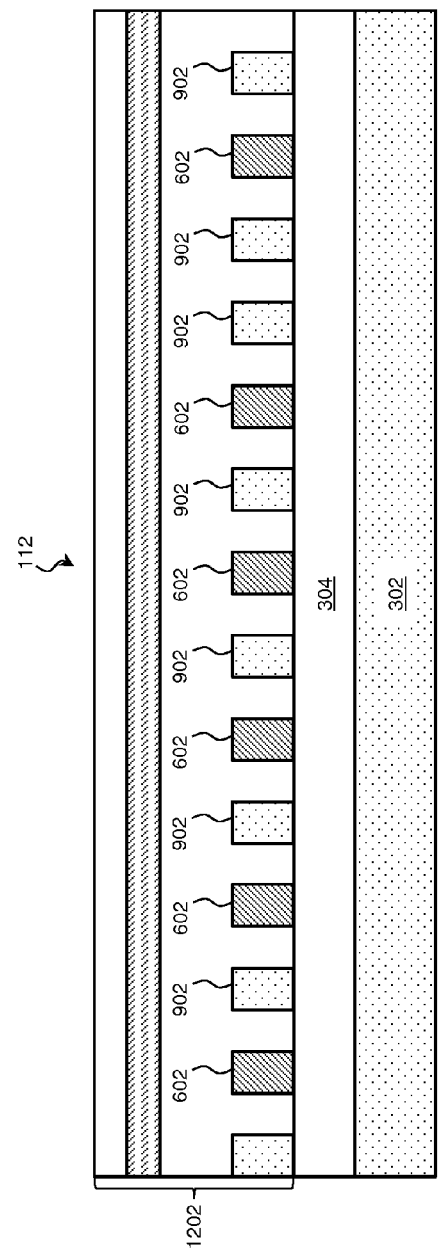

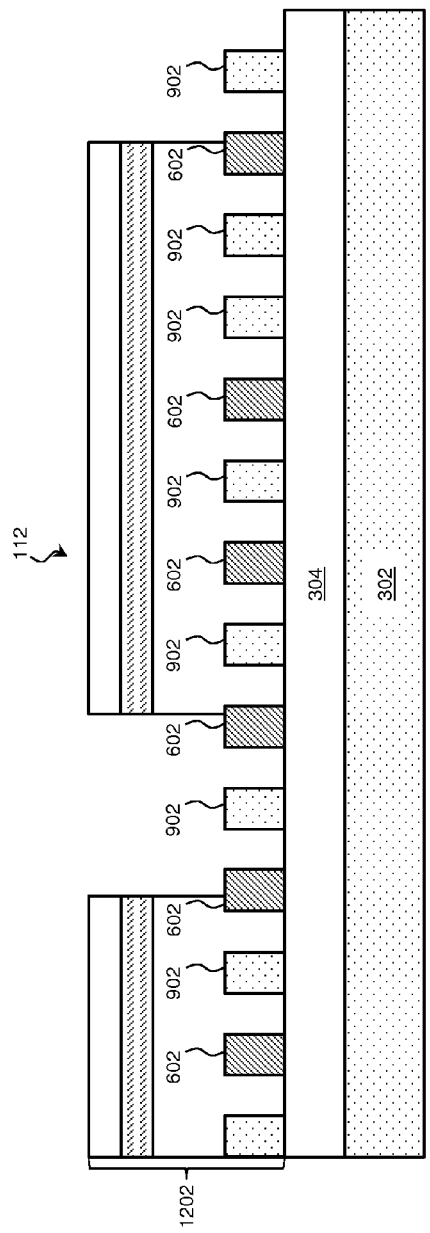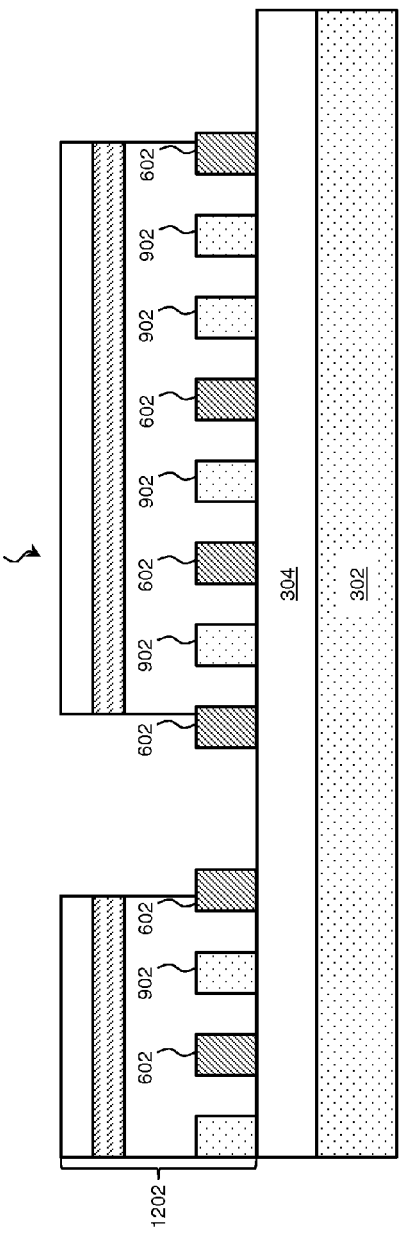

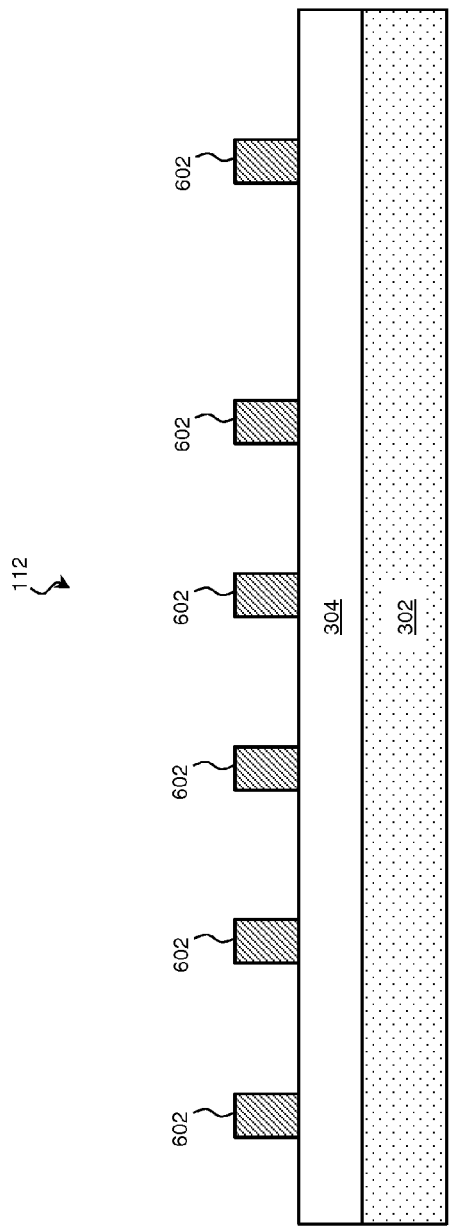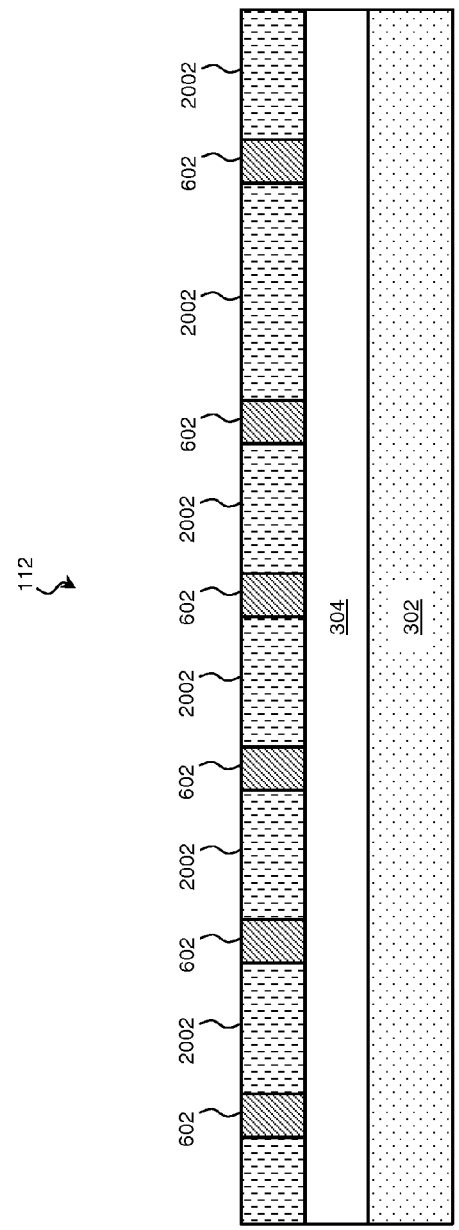

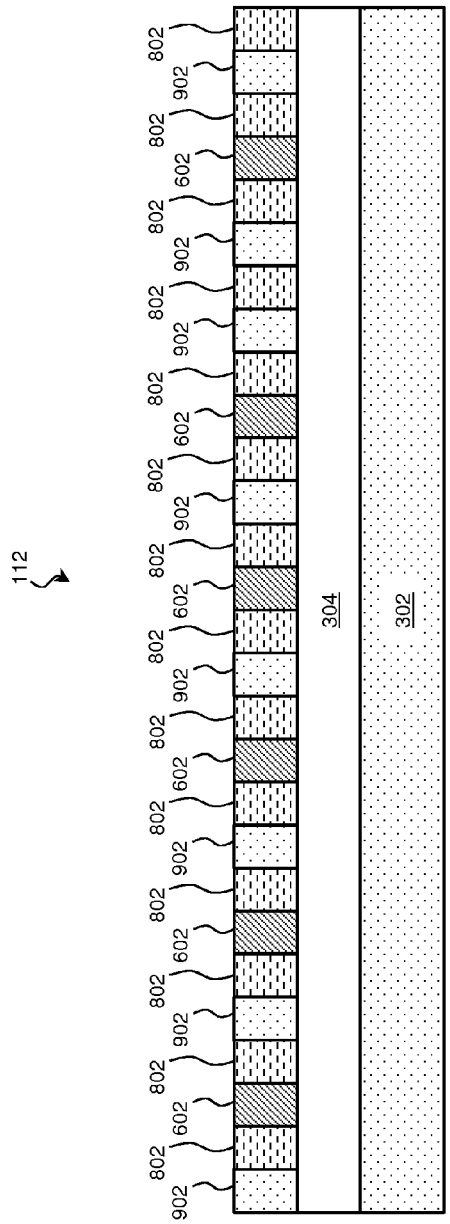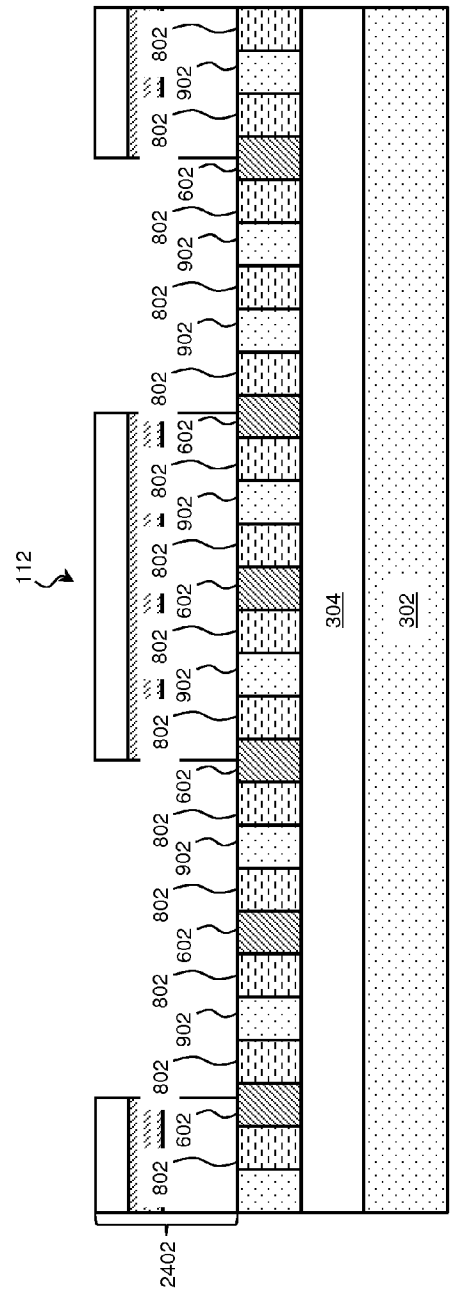

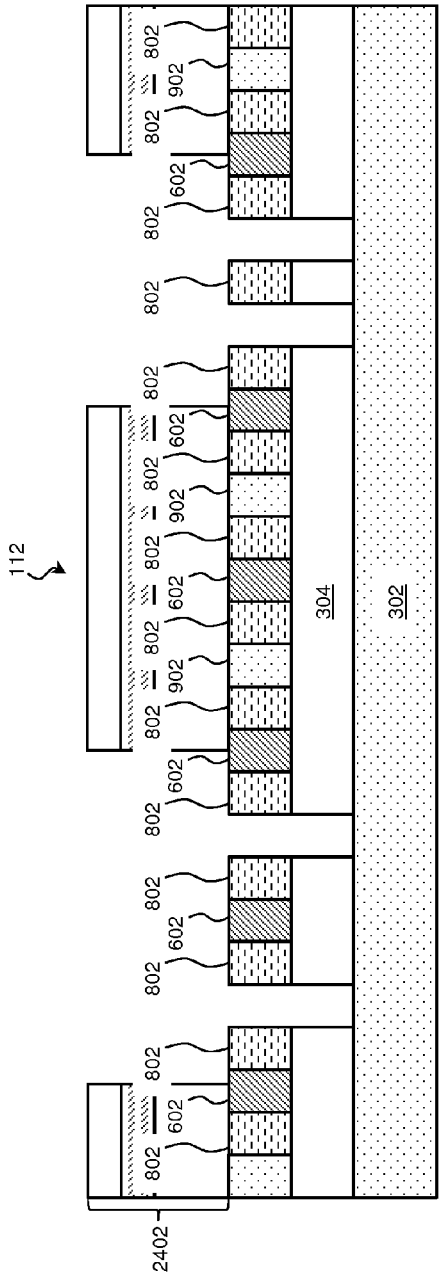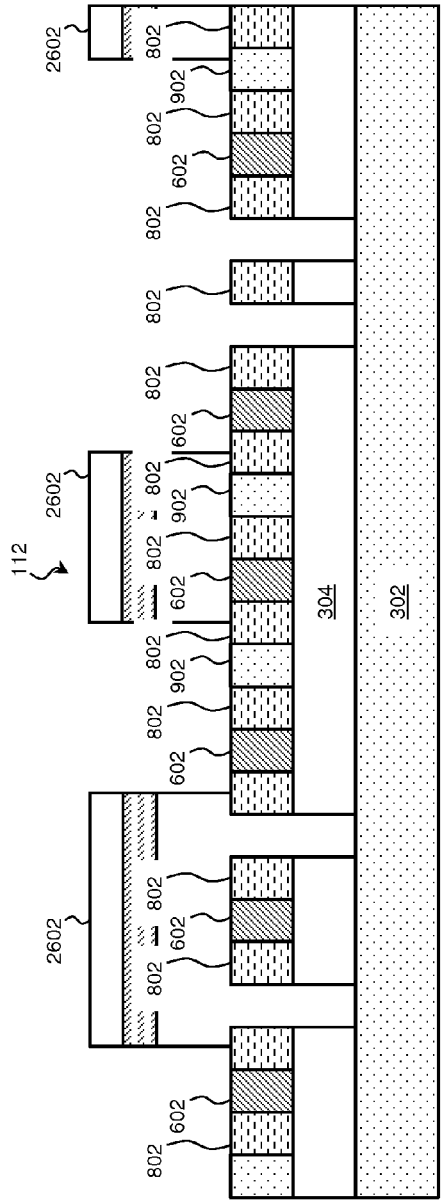

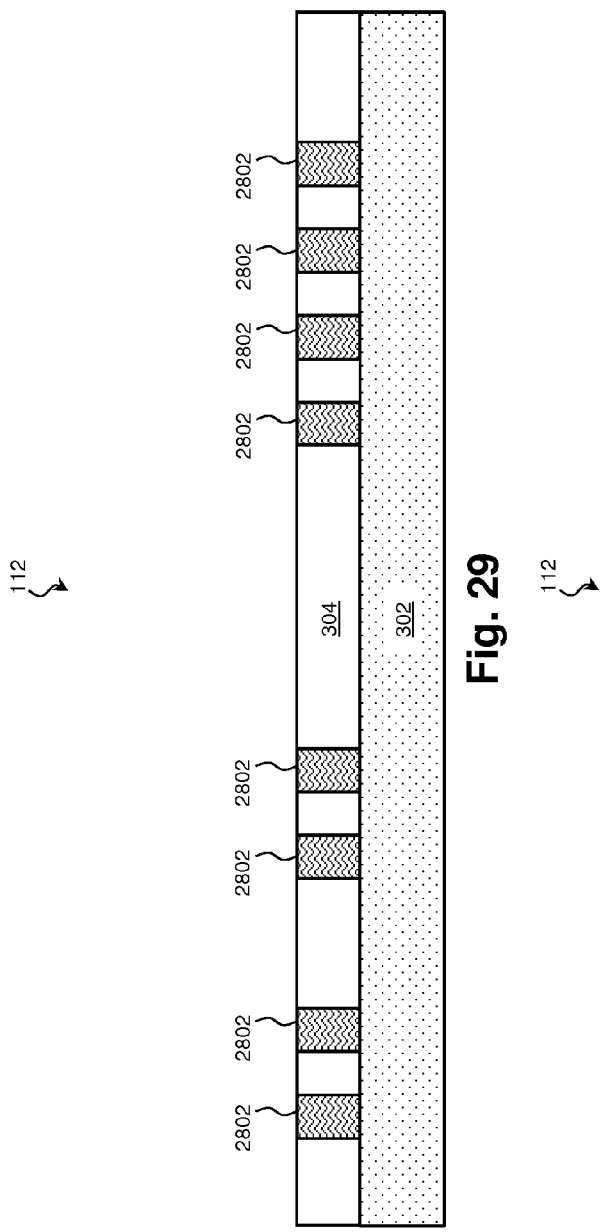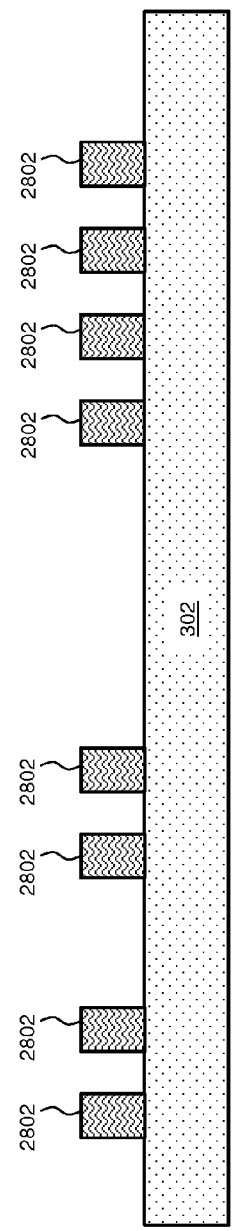

LITHOGRAPHIC TECHNIQUE INCORPORATING VARIED PATTERN MATERIALS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, advances in lithography have been important to reducing device size. In general, lithography is the formation of a pattern on a target. In one type of lithography, referred to as photolithography, radiation such as ultraviolet light passes through or reflects off a mask before striking a photoresist coating on the target. Photolithography transfers a pattern from the mask onto the photoresist, which is then selectively removed to reveal the pattern. The target then undergoes processing steps that take advantage of the shape of the remaining photoresist to create features on the target. Another type of lithography, referred to as direct-write lithography, uses a laser, an electron beam (e-beam), ion beam, or other narrow-focused emission to expose a resist coating or to pattern a material layer directly. E-beam lithography is one of the most common types of direct-write lithography, and, by directing a collimated stream of electrons to the area to be exposed, can be used to remove, add, or otherwise change a material layer with remarkable accuracy.

In order to pursue even smaller critical dimensions (CD) of device features, multiple lithographic patterning iterations may be performed in order to define a pattern. Likewise, lithographic patterning of a resist may be supplemented with other techniques, including deposition and etching, to further define the pattern before transferring it to an underlying layer. While such combinations add fabrication steps, they may also provide greater control and enable a wider range of patterns to be formed. Accordingly, despite the added challenge they may pose, novel combinations of patterning techniques and materials have the potential to further enhance CD control, overcome existing CD limitations, and thereby enable even more robust circuit devices to be manufactured.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-10 are cross-sectional views of a portion of the workpiece undergoing the patterning method according to various aspects of the present disclosure.

FIGS. 12-17 are further cross-sectional views of a portion of the workpiece undergoing the patterning method according to various aspects of the present disclosure.

FIGS. 19-21 are cross-sectional views of a portion of a workpiece undergoing the second patterning method according to various aspects of the present disclosure.

FIGS. 23-30 are cross-sectional views of a portion of the workpiece undergoing the third patterning method according to various aspects of the present disclosure.

DETAILED DESCRIPTION

Figure 1:
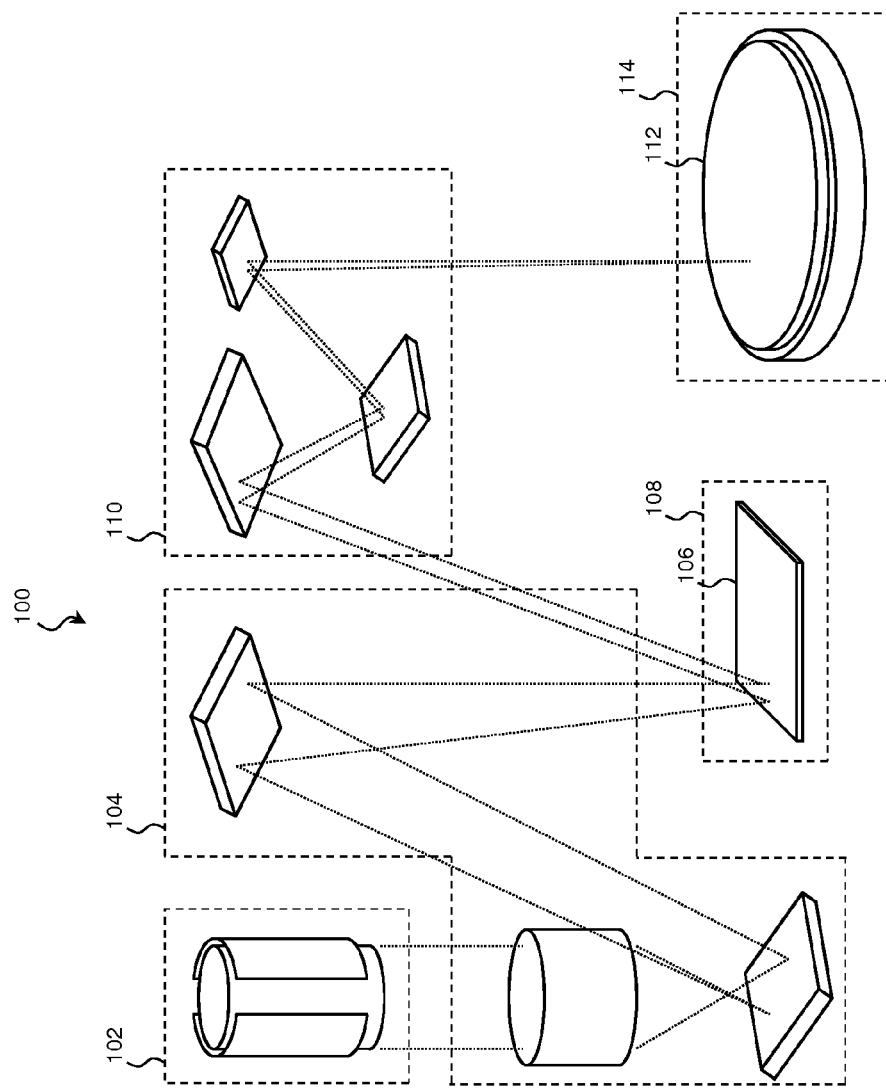
FIG. 1 is a block diagram of a photolithography system operable to perform a lithographic technique according to various aspects of the present disclosure.

The present disclosure relates generally to IC device manufacturing and, more particularly, to a system and technique for lithographically patterning a workpiece to form a set of features.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure relates to the patterning of a workpiece, such as a semiconductor substrate, using lithography. The techniques of the present disclosure apply equally to a wide range of lithographic techniques, including photolithography and direct-write lithography. For context, a photolithographic system suitable for use in implementing one such lithographic technique is described with reference to FIG. 1. In that regard, FIG. 1 is a block diagram of a photolithography system 100 operable to perform a lithographic technique according to various aspects of the present disclosure.

The lithography system 100, which may also be generically referred to as a scanner, is operable to perform a lithographic exposure process utilizing a characteristic radiation source and exposure mode. In the illustrated embodiments, the lithography system 100 is an extreme ultraviolet (EUV) lithography system designed to expose a workpiece using EUV radiation having a wavelength ranging between about 1 nm and about 100 nm. In some exemplary embodiments, the lithography system 100 includes a radiation source 102 that generates EUV radiation with a wavelength centered at about 13.5 nm. In one such embodiment, an EUV radiation source 102 utilizes laser-produced plasma (LPP) to generate the EUV radiation by heating a medium such as droplets of tin into a high-temperature plasma using a laser.

The lithography system 100 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or mirror arrays. The number of optical components shown FIG. 1 have been reduced for clarity, although in actual embodiments, the illuminator 104 may include dozens or even hundreds of lenses and/or mirrors. The optical components are arranged and aligned to project radiation emitted by the radiation source 102 onto a mask 106 retained in a mask stage 108. The optical components of the illuminator 104 may also shape the radiation along the light path in order to produce a particular illumination pattern upon the mask 106.

The mask 106 includes a number of reflective regions and absorptive regions (in the case of a reflective mask) and/or a number of transmissive regions and absorptive regions (in the case of a transmissive mask). After passing through or reflecting off the mask 106, the radiation is directed through a projection optics module 110, also referred to as a projection optics box (POB). Similar to the illuminator 104, the projection optics module 110 may include refractive optical components, including monolithic lenses and/or array lenses (e.g., zone plates), and may include reflective optical components, including monolithic mirrors and/or mirror arrays. The optical components of the projection optics module 110 are arranged and aligned to direct radiation transmitted through or reflecting off the mask 106 and to project it onto a workpiece 112, such as the illustrated semiconductor substrate or any other suitable workpiece, retained in a substrate stage 114. In addition to guiding the radiation, the optical components of the projection optics module 110 may also enlarge, narrow, focus, and/or otherwise shape the radiation along the light path.

The radiation reflected or transmitted by the mask 106 is used to expose the workpiece 112. Radiation projected by the projection optics module 110 on the workpiece 112 causes changes in a photosensitive component of the target. In a common example, the workpiece 112 includes a semiconductor substrate with a photosensitive resist layer. Portions of the photosensitive resist layer that are exposed to the radiation undergo a chemical transition making them either more or less sensitive to a developing process. In an exemplary embodiment, after exposure, the photosensitive resist layer undergoes a post-exposure baking, developing, rinsing, and drying in order to remove portions of the photosensitive resist layer and harden the remainder. Subsequent processing steps performed on the workpiece 112 may use the patterned resist to selectively process portions of the workpiece 112.

Figure 2:
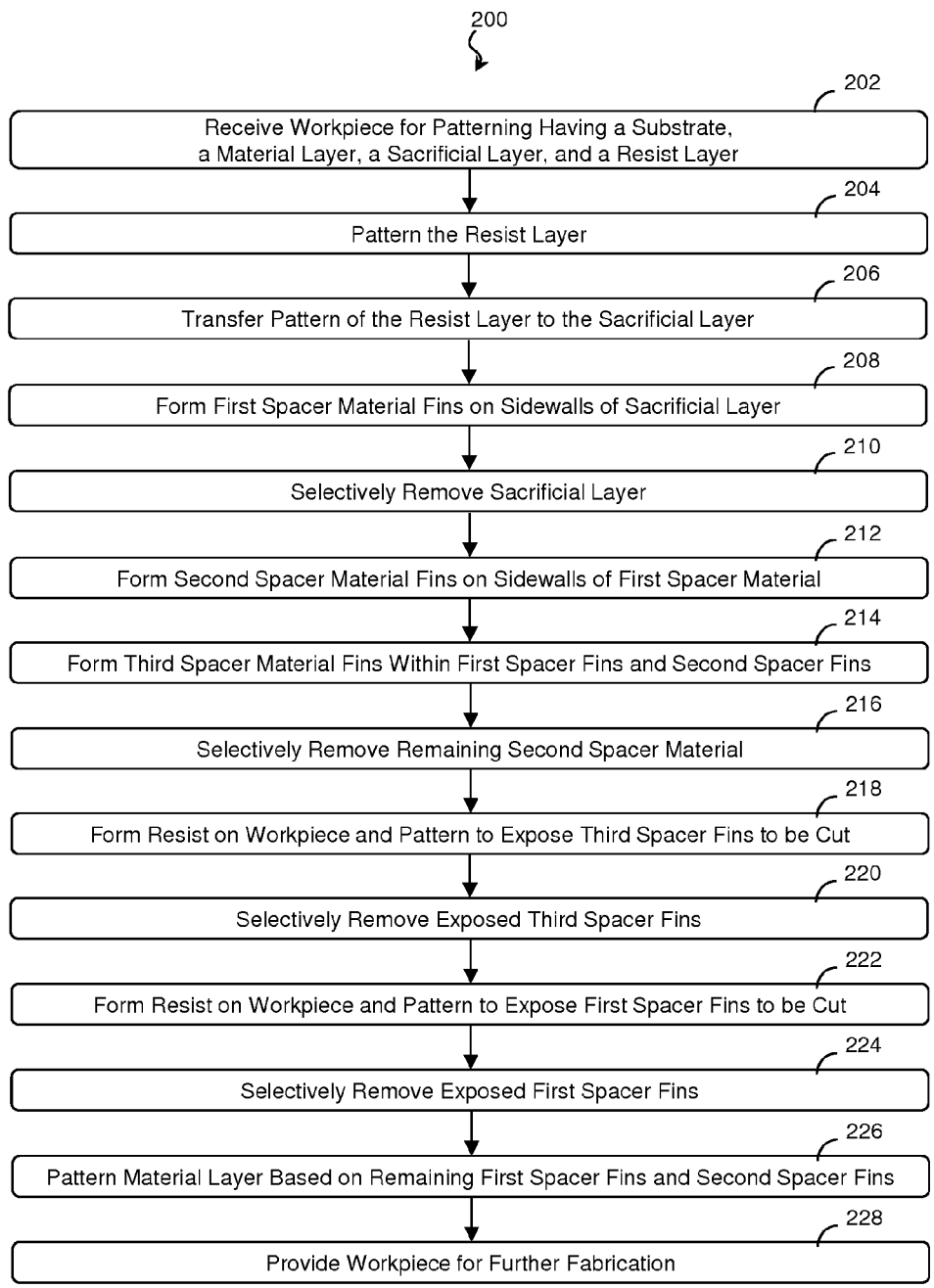
FIG. 2 is a flow diagram of a method for patterning a workpiece according to various aspects of the present disclosure.
Figures 11A, 11B:
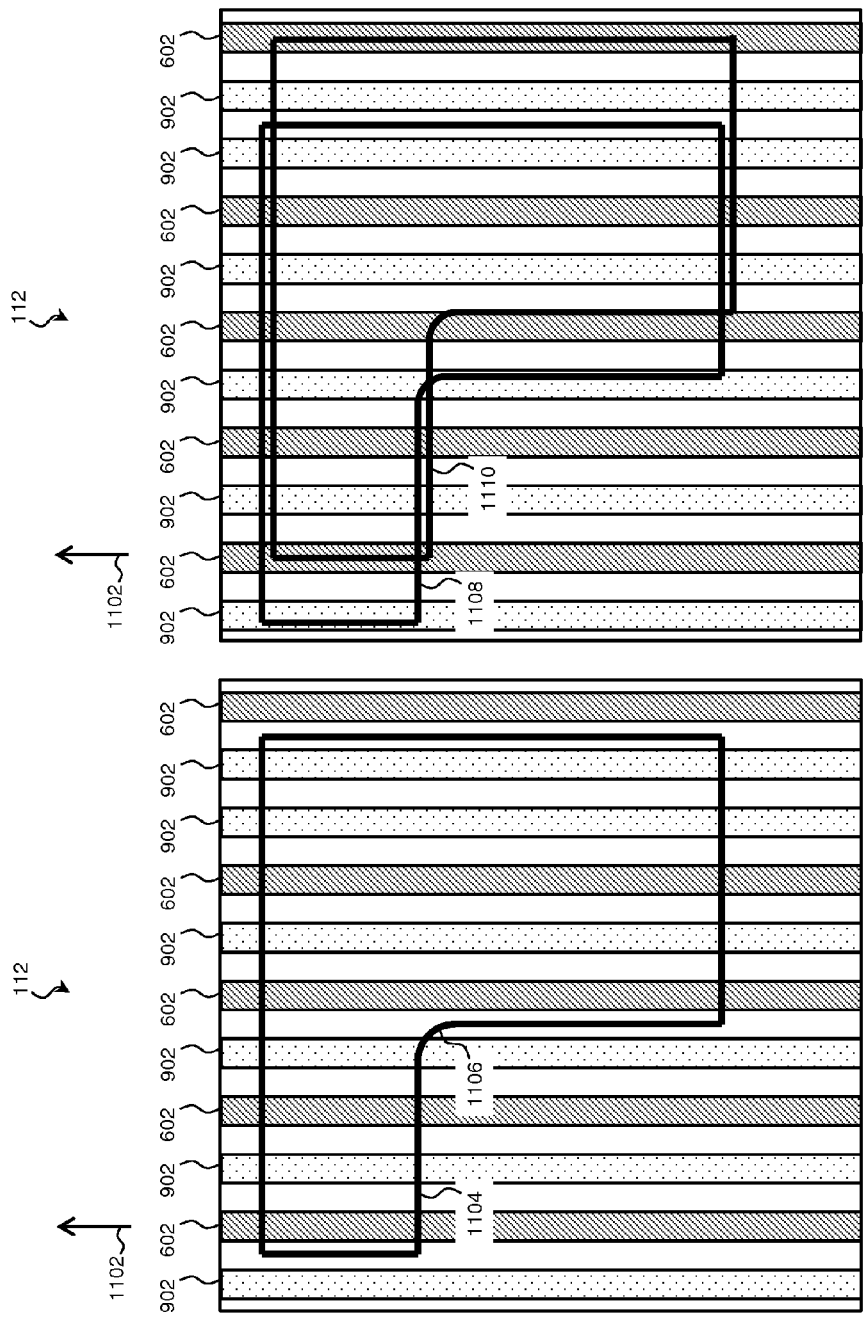
FIGS. 11A and 11B are top views of a portion of the workpiece undergoing the patterning method according to various aspects of the present disclosure.
Figure 15:
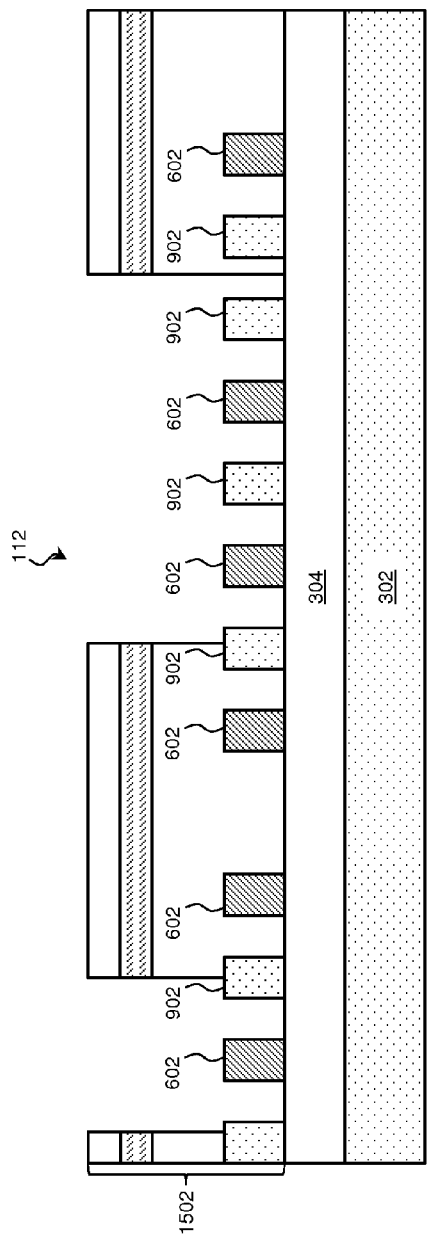

A technique for lithographic patterning, which may be performed using the lithography system 100 and/or any other suitable direct-write or photolithographic system will now be described with reference to FIGS. 2-17. As explained in more detail below, through the use of patterning materials with differing etchant sensitivities, the technique is able to relax alignment requirements between lithographic processes such as line-formation and line-cut. FIG. 2 is a flow diagram of a method 200 for patterning a workpiece 112 according to various aspects of the present disclosure. It is understood that additional steps can be provided before, during, and after the method 200 and that some of the steps described can be replaced or eliminated for other embodiments of the method 200. FIGS. 3-10 are cross-sectional views of a portion of the workpiece 112 undergoing the patterning method according to various aspects of the present disclosure. FIGS. 11A and 11B are top views of a portion of the workpiece 112 undergoing the patterning method according to various aspects of the present disclosure. FIGS. 12-17 are further cross-sectional views of a portion of the workpiece 112 undergoing the patterning method according to various aspects of the present disclosure. For clarity and ease of explanation, some elements of the figures have been simplified.

Referring to block 202 of FIG. 2 and to FIG. 3, a workpiece 112 is received for patterning. The exemplary workpiece 112 includes a substrate 302 upon which other materials may be formed. One common type of substrate 302 used in integrated circuit (IC) fabrication is a bulk silicon substrate. Additionally or alternatively, the substrate 302 may comprise another elementary (single element) semiconductor, such as germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. Possible substrates 302 also include a silicon-on-insulator (SOI) substrate. SOI substrates are fabricated using separation by implantation of oxygen (SIMOX), wafer bonding, and/or other suitable methods. In other examples, the substrate 102 may include a multilayer semiconductor structure.

The substrate 302 may include various doped regions (e.g., p-type wells or n-type wells), such as source/drain regions. The doped regions may be doped with p-type dopants, such as phosphorus or arsenic, and/or n-type dopants, such as boron or $BF_2$, depending on design requirements. The doped regions may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the doped regions include halo/pocket regions that can reduce short channel effects (e.g., punch-through effects) and may be formed by tilt-angle ion implantation or other suitable technique.

The substrate 302 may also include various material layers formed upon it. In the illustrated embodiment, the workpiece 112 includes a material layer 304 to be patterned and a sacrificial layer 306 disposed on the material layer 304. It will be recognized that the substrate 302 may have any number of material layers, masking layers, sacrificial layers, resist layers and/or other layers formed upon it. Suitable materials for these layers may be selected, in part, based on etchant selectivity. For example, the material layer 304 to be patterned and the sacrificial layer 306 may be structured to have different etchant sensitivities such that each layer can be removed using a corresponding etchant without significant etching of the other layer. For example, two materials may have a 10:1 sensitivity ratio to a given etchant, thus allowing the first material to be etched to a selected depth while only removing about 10% as much of the second material. Accordingly, in various embodiments, the material layer 304 includes a semiconductor and/or a dielectric material, such as a semiconductor oxide, semiconductor nitride, and/or semiconductor oxynitride, while the sacrificial layer 306 includes a different material having a different etchant sensitivity, such as a different semiconductor, semiconductor oxide, semiconductor nitride, semiconductor oxynitride, and/or other dielectric. In one such embodiment, the material layer 304 includes silicon oxide and the sacrificial layer 306 includes amorphous silicon, as these materials exhibit different etchant sensitivity.

A lithographically-sensitive resist (e.g., photoresist) 308 may be formed on the sacrificial layer 306. Any suitable resist 308 material or composition may be used, and the illustrated tri-layer photoresist resist 308 is one such example. The exemplary tri-layer resist 308 includes a bottom layer 310, a middle layer 312, and a top layer 314, each with different or at least independent materials. For example, the bottom layer 310 may include a $C_xH_yO_z$ material, the middle layer 312 may include a $SiC_xH_yO_z$ polymer material, and the top layer 314 may include a $C_xH_yO_z$ material with a photosensitive component that causes the top layer 314 to undergo a property change when exposed to radiation. This property change can be used to selectively remove exposed (in the case of a positive tone resist) or unexposed (in the case of a negative tone resist) portions of the resist 308. It is understood that in other embodiments, one or more layers of the tri-layer photoresist may be omitted and that additional layers may be provided as a part of the tri-layer photoresist.

Referring to block 204 of FIG. 2 and to FIG. 4, the resist layer 308 is patterned, and in the illustrated embodiment, the top layer 314 of the resist 308 is patterned first. Patterning may be performed using any suitable lithographic technique including photolithography and/or direct-write lithography. An exemplary photolithographic patterning process includes soft baking of the resist layer 308, mask aligning, exposure, post-exposure baking, developing the resist layer 308, rinsing, and drying (e.g., hard baking). An exemplary direct-write patterning process includes scanning the surface of the resist layer 308 with an e-beam or other energy source while varying the intensity of the energy source in order to vary the dosage received by various regions of the resist layer 308. As evident in the following description, the final pattern formed in the material layer 304 is based upon this first pattern, but other intermediate patterning steps alter the pattern before the method 200 is complete. The embodiment of FIG. 4 illustrates a first region 402, in which the shapes of the first pattern have a first pitch and width (e.g., a minimum pitch and width), and a second region 404, in which the shapes have a second pitch and width, (the boundary indicated by a dashed line) to demonstrate the flexibility of the present techniques to form features at a variety of spacings.

Referring to block 206 of FIG. 2 and to FIG. 5, the pattern is transferred from the resist layer 308 to the sacrificial layer 306 to form mandrels in the sacrificial layer. Mandrels are a feature shape that may be used to align subsequently formed spacers rather than to pattern the material layer 304 directly. The transfer of the pattern to the sacrificial layer 306 may include one or more etching processes to expand the opening formed in the resist layer 308 downward. In this manner, the resist layer 308 (and/or the top layer 314 thereof) is a mask for the etching process(es). The transfer may include any suitable etching process including wet etching, dry etching, reactive ion etching, ashing, and/or other suitable technique. The etching process and/or etching reagents may be selected to etch the sacrificial layer 306 without significant etching of the material layer 304. Any remaining resist 308 may be stripped following the patterning of the sacrificial layer 306.

Referring to block 208 of FIG. 2 and to FIGS. 6A and 6B, a first spacer 602 is formed on the sidewalls of the mandrels of the sacrificial layer 306. Owing in part to their shape, the first spacer 602 structures may be referred to as fins. The material of the first spacer 602 fins may include any suitable semiconductor, semiconductor oxide, semiconductor nitride, semiconductor oxynitride, other dielectric, and/or other suitable material and may be selected to have different etchant sensitivity the material layer 304 and the sacrificial layer 306. For example, in an embodiment with a silicon oxide material layer 304 and an amorphous silicon sacrificial layer 306, the first spacer 602 fins include silicon nitride.

One technique for forming the first spacer 602 fins on the sidewalls of the sacrificial layer 306 without substantial spacer material remaining on the horizontal surfaces of the workpiece 112 is a deposition and etching process shown in FIGS. 6A and 6B. Referring first to FIG. 6A, in an embodiment, the material of first spacer 602 is deposited on the sacrificial layer 306 and on the material layer 304 by any suitable process including atomic layer deposition (ALD), chemical vapor deposition (CVD), plasma-enhanced CVD (PE CVD), and/or other suitable deposition techniques. Conformal deposition techniques may be used, despite depositing material on the horizontal surfaces as shown in FIG. 6A. To remove this extraneous material, an anisotropic etching such as a dry or plasma etching, may be performed to etch back and remove those portions of the first spacer 602 deposited on the horizontal surfaces of the sacrificial layer 306 and the material layer 304 as shown in FIG. 6B. In this way, only those portions of the first spacer 602 deposited on the vertical surfaces of the sacrificial layer 306 mandrels remain. In various examples, the deposition thickness and the etching technique are tuned to control the horizontal thickness (indicated by reference marker 604) of the first spacer 602 fins. The thickness of these first spacer 602 fins is correlated to the thickness of the features to be formed in the material layer 304, and, in many embodiments, deposition and etching can be manipulated for more precise control of feature thickness than can be achieved by lithography alone.

Referring to block 210 of FIG. 2 and to FIG. 7, the mandrels of the sacrificial layer 306 may be selectively removed, leaving the first spacer 602 fins disposed on the material layer 304. Any suitable etching technique may be used to selectively remove the mandrels including wet etching, dry etching, reactive ion etching, ashing, and/or other suitable techniques and the etching technique and etchant chemistry may utilize the etching selectivity of the sacrificial layer 306 to remove the mandrels without significant etching of the first spacer 602 or the material layer 304.

Referring to block 212 of FIG. 2 and to FIG. 8, a second spacer 802 material is formed on the sidewalls of the first spacer 602 fins to form a set of second spacer 802 fins. The second spacer 802 material may include any suitable semiconductor, semiconductor oxide, semiconductor nitride, semiconductor oxynitride, and/or other suitable material and may be selected to have different etchant sensitivity than the first spacer 602 and the material layer 304. In an exemplary embodiment, the second spacer 802 includes amorphous silicon to provide the desired etchant selectivity. Similar to the first spacer 602, the material of the second spacer 802 may be formed by a deposition and etch back process. In that regard, the second spacer 802 may be deposited conformally on the workpiece 112 by any suitable process including ALD, CVD, PE CVD, and/or other suitable deposition technique and subsequently etched using an anisotropic etching such as an anisotropic dry or plasma etching technique. In various examples, the deposition thickness and the etching technique are tuned to control the horizontal thickness of the second spacer 802 fins, as this is correlated to the thickness of those features eventually formed in the material layer 304 as well as the spacing between these features.

Referring to block 214 of FIG. 2 and to FIG. 9, a third spacer 902 is formed in recesses defined by the first spacer 602 and the second spacer 802. The third spacer 902 may include any suitable semiconductor, semiconductor oxide, semiconductor nitride, semiconductor oxynitride, and/or other suitable material and may be selected to have different etchant sensitivity than the first spacer 602, the second spacer 802, and the material layer 304. For example, the third spacer 902 may include an ashing removable dielectric (ARD). In some embodiments (e.g., those in which third spacer fins are to be formed at a minimum pitch), a deposition process without an etch back process may be sufficient to form the third spacer 902 fins. In some embodiments (e.g., those in which fins are to be formed at an irregular pitch, see reference marker 904), deposition is followed by an etch back process so that the third spacer 902 fins are formed on the vertical sidewalls of the workpiece 112 without substantial deposition on the horizontal surfaces. Deposition and any etch back process may be performed substantially as described in the context of the first spacer 602 and the second spacer 802. Following the deposition of the third spacer 902, a chemical-mechanical polishing/planarization (CMP) process may be performed to planarize a top surface of the workpiece 112 defined by the first, second, and third spacers.

Referring to block 216 of FIG. 2 and to FIG. 10, the second spacer 802 is selectively removed leaving behind the first spacer 602 fins and the third spacer 902 fins while exposing a portion of the material layer 304. Any suitable etching technique may be used to selectively remove the second spacer 802 including wet etching, dry etching, reactive ion etching, ashing, and/or other suitable techniques and the etching technique and etchant chemistry may utilize the etching selectivity of the second spacer 802 to remove the material without significant etching of the surrounding structures. The remaining fins of the first spacer 602 and the third spacer 902 extend in parallel lines along a longitudinal axis 1102, as can be seen in FIGS. 11A and 11B.

In the steps that follow, selected portions of the first spacer 602 fins and of the third spacer 902 fins are removed in what may be referred to as a fin-cut or line-cut procedure. The fin-cut prevents the corresponding features from being formed in the material layer 304. In many embodiments, lithographic patterning is used to define cut regions in which the first spacer 602 and/or third spacer 902 are to be removed. An exemplary cut region is illustrated in FIG. 11A by bounding box 1104. When using a lithographic technique to define the cut region, as with many multiple patterning applications, even small errors in alignment may render the workpiece 112 unusable. However, it is been determined that through the use of varying spacer materials and separate cut processes for each material, alignment requirements may be relaxed. For example, if a single fin-cut is used to remove all the targeted fins (as would be the case if only single fin material were used or if the exemplary cut region 1104 were used to cut both the first spacer 602 fins and the third spacer 902 fins), longitudinal edges of the cut region 1104 should be aligned between the spacers as shown in FIG. 11A. The margin of error is, at best, the spacing between the fins measured perpendicular to the longitudinal direction. Moreover, curved portions (e.g., curved portion indicated by reference marker 1106) should be carefully controlled to avoid unintended rounding of the fins.

In contrast, if multiple fin-cut procedures are used, each targeting a different fin material, the alignment requirements may be greatly relaxed. For example, FIG. 11B shows a technique using two cut regions to achieve the same effect. Specifically, cut region 1108 is used to remove only first spacer 602 fins, and cut region 1110 is used to remove only third spacer 902 fins. In FIG. 11B, cut region 1110 is offset longitudinally for clarity. As can be seen, longitudinal edges of the cut regions may be aligned anywhere between those features to be cut, first spacer 602 fins in the case of cut region 1108 and second spacer 802 fins in the case of cut region 1110. Thus, the margin of error is the spacing between adjacent fins of the same material type. There is also greater leeway for curved portions of the cut region without rounding the fins. These relaxed alignment requirements may be leveraged to improve yield, to further reduce CD, and/or to fabricate wholly novel patterns in the material layer 304.

Referring to blocks 218-224, two separate cut procedures are performed, each etching a specific spacer material. It is understood that the concepts of the present disclosure apply to any number of separate material-specific fin-cut procedures and that any spacer material may be etched in any order. In one such embodiment, a first fin-cut procedure is performed on the third spacer 902 fins as shown in blocks 218-220. Referring to block 218 and FIG. 12, a resist 1202, such as a tri-layer photoresist, is formed on the workpiece 112 and patterned as shown in FIG. 13 to expose those portions of the third spacer 902 fins to be removed. Patterning may be performed using any suitable lithographic technique including photolithography and/or direct-write lithography. The patterned resist 1202 may also expose portions of the first spacer 602 fins. However, because the subsequent etching selectively removes the third spacer 902 material, exposed portions of the first spacer 602 may remain substantially un-etched.

Referring to block 220 of FIG. 2 and to FIG. 14, the exposed portions of the third spacer 902 fins may be removed by an etching process or other suitable technique. For example, the third spacer 902 may be removed by wet etching, dry etching, reactive ion etching, ashing, and/or other suitable technique. The etching process and/or etching chemistry may be selected to etch the third spacer 902 without significant etching of the first spacer 602 or the underlying material layer 304. Any remaining portion of the resist 1202 may be removed following the etching.

As shown in blocks 222-224, a cut procedure is then performed on the first spacer 602 fins. It is reiterated that the first spacer 602 and third spacer 902 may be cut in any order. Referring to block 222 of FIG. 2 and to FIG. 15, another resist 1502, such as a tri-layer photoresist, may be formed on the workpiece 112 and patterned to expose those portions of the first spacer 602 to be removed. Patterning may be performed using any suitable lithographic technique including photolithography and/or direct-write lithography. The pattern of the resist 1502 may also expose portions of the third spacer 902 and/or the material layer 304. However, because the subsequent etching selectively removes the first spacer 602 material, the surrounding structures may remain substantially un-etched.

Figure 16:
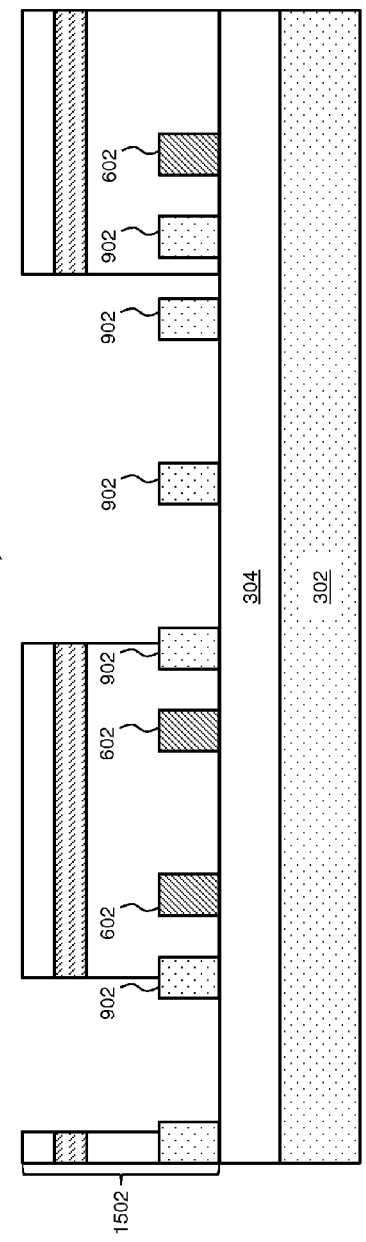

Referring to block 224 of FIG. 2 and to FIG. 16, the exposed portions of the first spacer 602 fins may be removed by an etching process or other suitable technique. For example, this may include wet etching, dry etching, reactive ion etching, ashing, and/or other suitable technique. The etching process and/or etching reagents may be selected to etch the first spacer 602 without significant etching of the third spacer 902 or the underlying material layer 304. Any remaining portion of the resist 1502 may be removed following the etching.

Figure 17:
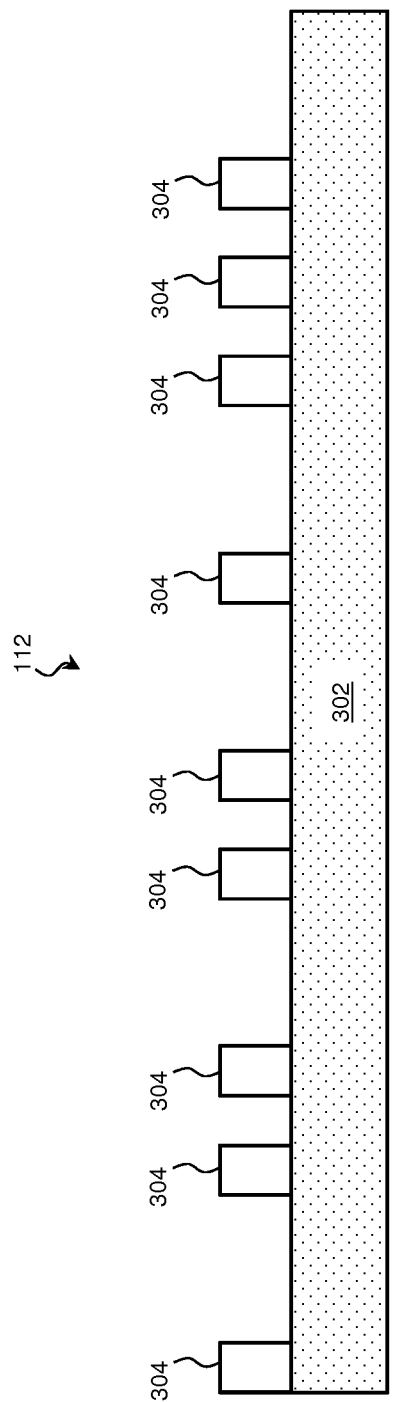

Referring to block 226 of FIG. 2 and to FIG. 17, the material layer 304 is patterned using the remaining portions of the first spacer 602 and/or the third spacer 902 as a hard mask. Patterning the material layer may include any suitable etching technique, such as wet etching, dry etching, reactive ion etching, ashing, and/or other suitable technique. In this way, the final pattern is formed on the material layer 304. Afterwards, any remaining portions of the first spacer 602 and/or the third spacer 902 may be removed. As explained above, by using different materials with different etchant sensitivity, this improved patterning may relax alignment requirement, may reduce feature rounding from curves in the cut regions, and may provide for a cleaner final pattern. Of course, these benefits are merely exemplary, and no benefit is required for any particular embodiment.

After patterning the material layer 304, the workpiece 112 may be provided for further fabrication processes in block 228. The patterned material layer 304 may be used in conjunction with any etching process, deposition process, implantation process, epitaxy process, and/or any other fabrication process. In various examples, the patterned material layer 304 is used to fabricate a gate stack, to fabricate an interconnect structure, to form non-planar devices by etching to expose a fin or by epitaxially growing fin material, and/or other suitable applications.

In the preceding examples, the second spacer 802 and third spacer 902 are formed using separate deposition processes. In contrast, in some embodiments, a directed self-assembly (DSA) material is used that separates into a suitable second spacer 802 material and third spacer 902 material as part of a curing process. To explain in more detail, DSA materials take advantage of the tendency of some copolymer materials to align in regular, repeating patterns, such as spherical, cylindrical, lamellar (layered), and/or bicontinuous gyroid arrangements, in what is termed microphase separation. The morphology of the microphase separated copolymer may depend on the polymers used, the relative amounts of the constituent polymers, process variables including temperature, and other factors. By controlling the components and ratios of a DSA material as well as the curing process, an undifferentiated DSA layer can be applied that will separate into individually-etchable second spacer 802 fins and third spacer 902 fins arranged at a specified pitch.

Figure 18:
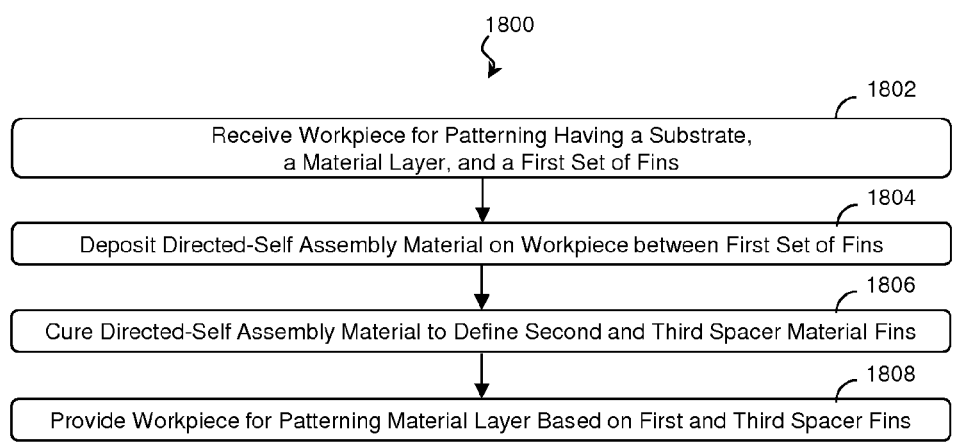
FIG. 18 is a flow diagram of a second method for patterning a workpiece using a directed self-assembly material according to various aspects of the present disclosure.
Figure 21:
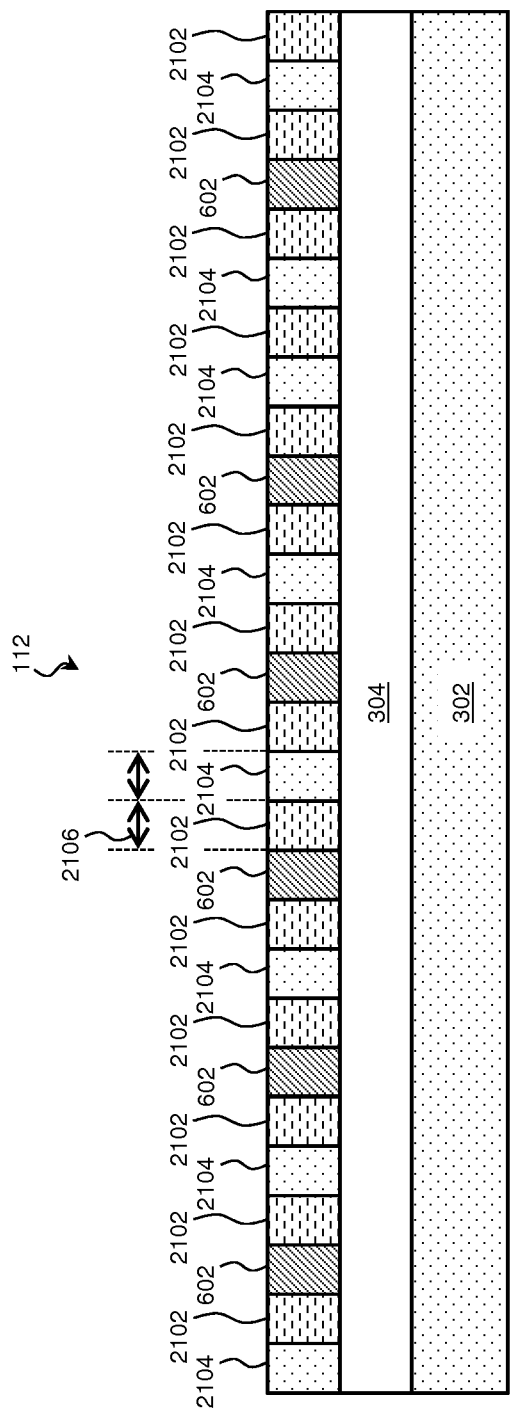

A technique for fabrication using a DSA material is described with reference to FIGS. 18-21. FIG. 18 is a flow diagram of a second method 1800 for patterning a workpiece 112 using a directed self-assembly material according to various aspects of the present disclosure. It is understood that additional steps can be provided before, during, and after the method 1800 and that some of the steps described can be replaced or eliminated for other embodiments of the method 1800. FIGS. 19-21 are cross-sectional views of a portion of a workpiece 112 undergoing the second patterning method according to various aspects of the present disclosure. For clarity and ease of explanation, some elements of the figures have been simplified.

Referring to block 1802 of FIG. 18 and to FIG. 19, a workpiece 112 is received that includes a substrate 302, a material layer 304 to be patterned, and a set of first spacer 602 fins, each of which may be substantially similar to those described with reference to FIGS. 2-7. In that regard, the first spacer 602 fins may be formed substantially as described in blocks 202-210 of FIG. 2. Referring to block 1804 of FIG. 18 and to FIG. 20, a directed self-assembly (DSA) material 2002 is deposited on the workpiece 112 and between the first spacer 602 fins. As explained above, the DSA material 2002 includes a copolymer or other compound that assembles into regions of uniform composition when a curing process is performed. In some embodiments, the DSA material 2002 is selected so that these regions are selectively etchable and so that the regions have the desired size and shape. In particular, by adjusting the molecular weight of the DSA material 2002 components, the horizontal width of the resulting regions can be controlled, giving designers a precise mechanism by which to control fin width and feature dimension. Various suitable DSA materials include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). The DSA material(s) may be deposited by any suitable method, some of which include spin-on coating, spraying, dip coating, and other suitable methods.

Referring to block 1806 of FIG. 18 and to FIG. 21, a curing process is performed on the DSA material 2002. The curing process causes the components of the DSA material 2002 to self-assemble into second spacer 2102 fins and third spacer 2104 fins. The specific curing process may be tailored to the DSA material, and in many examples includes heating the workpiece 112 and exposing the DSA material 2002 to ultraviolet light. Along with other parameters, the duration of the heating and the temperature profile during the heating process may be adjusted in order to control the horizontal widths (indicated by reference marker 2106) of the second spacer 2102 fins and the third spacer 2104 fins. Similar to the second spacer 802 fins and third spacer 902 fins of FIGS. 2-17, the second spacer 2102 fins and the third spacer 2104 fins may have etching sensitivities that are different from each other and from the first spacer 602 material and the material layer 304.

Referring to block 1808 of FIG. 18, following the curing process, the workpiece 112 may be provided for patterning the material layer 304 using the first spacer fins 602 and the third spacer fins 2104. This may include removal of the second spacer 2102 fins and one or more material-selective fin cut procedures substantially as described in blocks 216-224 of FIG. 2 and FIGS. 10-16. The pattern of the remaining first spacer 602 fins and third spacer 2104 fins may be transferred to the material layer 304 substantially as described in block 226 of FIG. 2 and FIG. 17. Subsequently, the workpiece 112 may be provided for use in fabricating a gate stack, in fabricating an interconnect structure, in forming non-planar devices by etching to expose a fin or by epitaxially growing fin material, and/or other suitable applications substantially as described in block 228 of FIG. 2.

Figure 22:
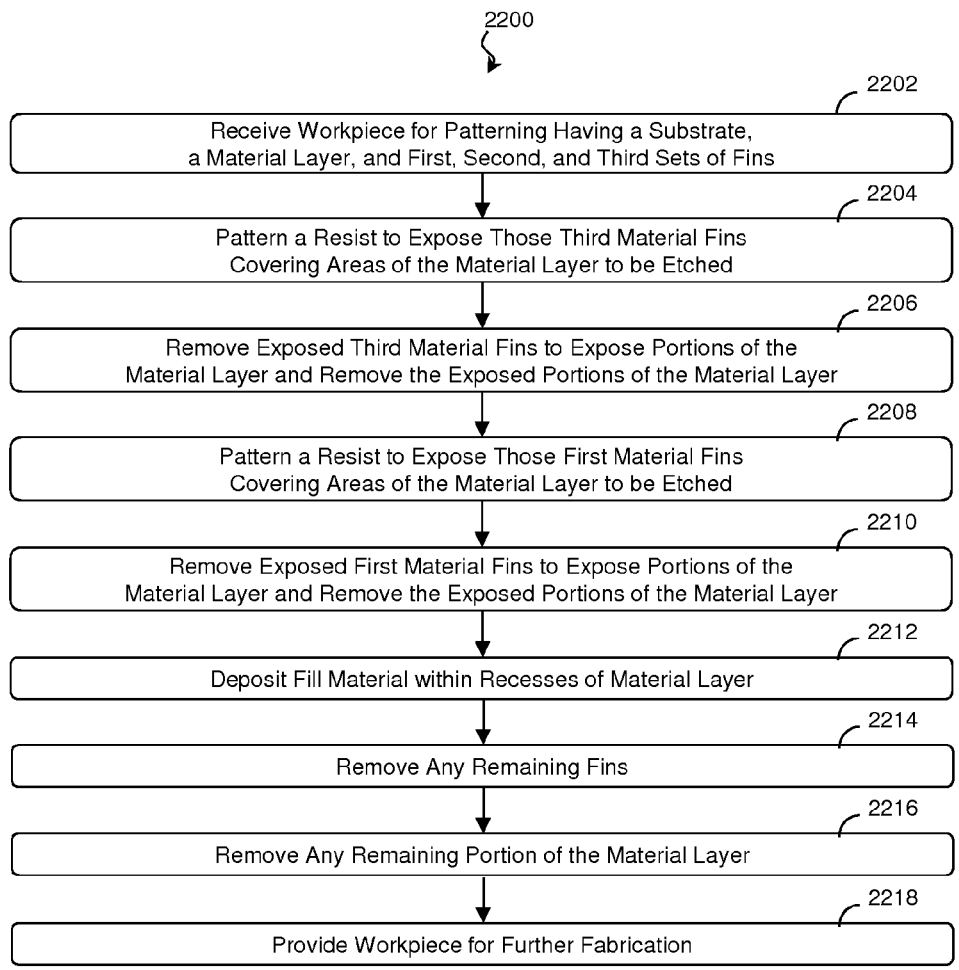
FIG. 22 is a flow diagram of a third method for patterning a workpiece according to various aspects of the present disclosure.

In the preceding examples, the first spacer fins and third spacer fins are formed on regions of the material layer to be preserved. A variation of this technique where the first spacer fins and third spacer fins are formed on regions of the material layer to be etched is described with reference to FIGS. 22-30. FIG. 22 is a flow diagram of a third method 2200 for patterning a workpiece 112 according to various aspects of the present disclosure. It is understood that additional steps can be provided before, during, and after the method 2200 and that some of the steps described can be replaced or eliminated for other embodiments of the method 2200. FIGS. 23-30 are cross-sectional views of a portion of the workpiece 112 undergoing the third patterning method according to various aspects of the present disclosure. For clarity and ease of explanation, some elements of the figures have been simplified.

Referring to block 2202 of FIG. 22 and to FIG. 23, a workpiece 112 is received that includes a substrate 302, a material layer 304 to be patterned, a set of first spacer 602 material fins, a set of second spacer 802 material fins, and a set of third spacer 902 material fins. Each element may be substantially similar to those described above with reference to FIGS. 2-21 and may be formed by any of the aforementioned techniques or any other suitable technique (e.g., blocks 202-214 of FIG. 2, blocks 1802-1806 of FIG. 18, etc.). For example, the second spacer 802 fins and third spacer 902 fins may be formed by the deposition and etch back techniques of blocks 212-214 of FIG. 2 and/or by deposition and curing of a DSA material as described in blocks 1804-1806 of FIG. 18.

Once the workpiece 112 is received, individual fin-cut procedures are performed that selectively target either the first spacer 602 material or the third spacer 902 material. It is understood that the concepts of the present disclosure apply to any number of separate material-specific fin-cut procedures and that any spacer material may be etched in any order. In one such embodiment, a first fin-cut procedure is performed on the third spacer 902 fins as shown in blocks 2204-2206. Referring first to block 2204 of FIG. 22 and to FIG. 24, a resist 2402, such as a tri-layer photoresist, is formed on the workpiece 112 and patterned to expose those portions of the third spacer 902 fins that define areas of the material layer 304 to be etched. This is in contrast to examples where the resist exposes those portions of the third spacer 902 to be removed without transferring the pattern to the material layer 304. Also in contrast to some previous examples, the second spacer 802 fins may be present on the workpiece 112 during the fin-cut procedures as illustrated in FIG. 24. The pattern of the resist 2402 may also expose portions of the first spacer 602 fins. However, because the subsequent etching selectively removes the third spacer 902 material and the material layer 304, exposed portions of the first spacer 602 may remain substantially un-etched.

In that regard, referring to block 2206 of FIG. 22 and to FIG. 25, the exposed portions of the third spacer 902 fins may be removed to expose portions of the material layer 304 and the exposed portions of the material layer 304 may then be etched. This may be performed by separate etching steps or in a combined etching process, and accordingly, any suitable wet etching, dry etching, reactive ion etching, ashing, and/or other suitable technique(s) may be performed on the workpiece in block 2206. The etching process(es) and/or etching chemistries may be selected to etch the third spacer 902 and the material layer 304 without significant etching of the first spacer 602 or the second spacer 802. Any remaining portion of the resist 2402 may be removed following the etching of block 2206.

A second fin-cut procedure may then be performed on the first spacer 602 fins. It is reiterated that the first spacer 602 and third spacer 902 may be cut in any order. Referring to block 2208 and to FIG. 26, another resist 2602, such as a tri-layer photoresist, may be formed on the workpiece 112. The resist 2602 may be deposited within the material layer 304 and may fill the recesses formed in block 2206. The resist 2602 may be patterned to expose those portions of the first spacer 602 to be transferred to the material layer 304. Patterning may be performed using any suitable lithographic technique including photolithography and/or direct-write lithography. The pattern of the resist 2602 may also expose portions of the second spacer 802 and/or the third spacer 902. However, because the subsequent etching selectively targets the first spacer 602 material, the surrounding structures may remain substantially un-etched.

Figure 27:
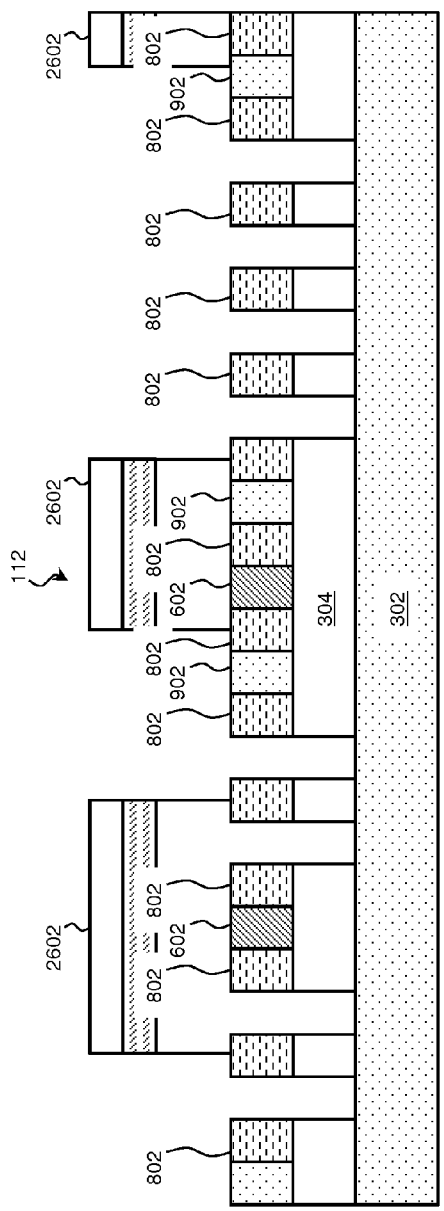

Referring to block 2210 of FIG. 22 and to FIG. 27, the exposed portions of the first spacer 602 fins may be removed to expose portions of the material layer 304 and the exposed portions of the material layer 304 by an etching process or other suitable technique. This may be performed by separate etching steps or in a combined etching process, and accordingly, any suitable wet etching, dry etching, reactive ion etching, ashing, and/or other suitable technique(s) may be performed on the workpiece in block 2210. The etching process(es) and/or etching chemistries may be selected to etch the first spacer 602 and the material layer 304 without significant etching of the second spacer 802 or the third spacer 902. Any remaining portion of the resist 2602 may be removed following the etching of block 2210.

Figure 28:
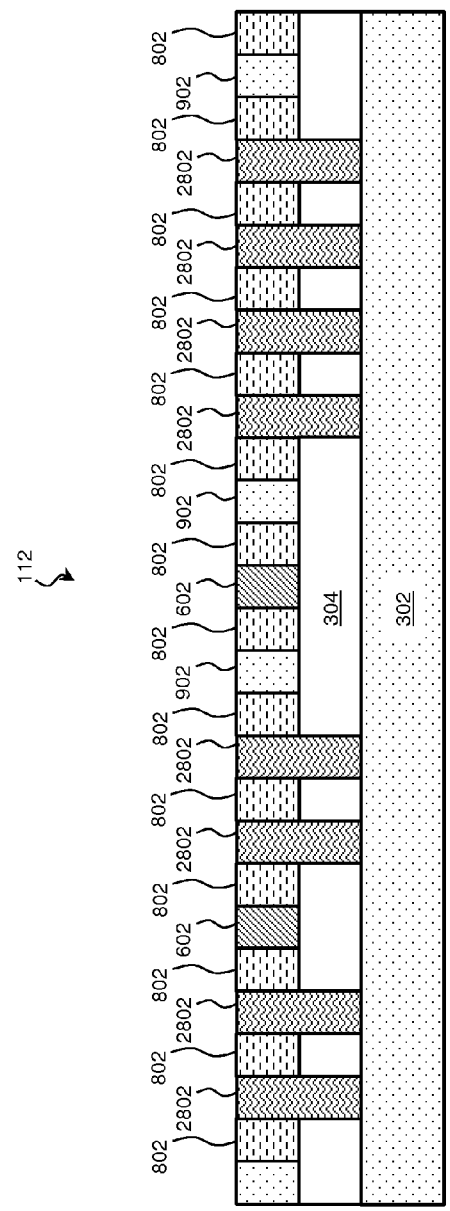

Referring to block 2212 of FIG. 22 and to FIG. 28, one or more fill materials 2802 may be deposited within the recesses formed in the material layer 304 in blocks 2204-2210. Any suitable fill material 2802 may be deposited within the recesses, and although various exemplary embodiments are presented, it is understood that the technique of the present disclosure may be used with any fill material 2802 as part of any fabrication process. In an example where the material layer 304 is an inter-layer dielectric used to form an interconnect structure, the fill material 2802 includes a conductor, such as Ti, TiN, W, Al, other metallic conductors, and/or non-metallic conductors. In an example where the material layer 304 is used to define a gate structure, the fill material 2802 includes an interfacial dielectric, a high-k gate dielectric, a gate electrode material, and/or one or more capping materials. In an example where the material layer 304 is used to form a fin for a non-planar device, the fill material 2802 includes an epitaxially-grown semiconductor. In these examples and others, the fill material 2802 may be formed by any suitable process including spin-on deposition, sputtering, ALD, CVD, physical vapor deposition (PVD), and/or other suitable processes.

Referring to block 2214 of FIG. 22 and to FIG. 29, the remaining first spacer 602 fins, second spacer 802 fins, and third spacer 902 fins are removed. This may be performed either before or after the deposition of the fill material 2802 in block 2212. Each order has different benefits and tradeoffs. For example, while the spacer fins are present, the recesses to be filled are deeper. The higher aspect ratio may make deposition with the spacer fins more challenging as the circulation of reactants at the bottom of the recess may be reduced. However, removing the spacer fins before deposition may compromise the shapes formed in the material layer 304. Thus, blocks 2212 and 2214 may be performed in any order suited to the application.

Also depending on the application, the remaining material layer 304 may be removed leaving the fill material 2802 on the substrate 302 as shown in block 2216 of FIG. 22 and FIG. 30. Referring to block 2218 of FIG. 22, the workpiece 112 may be provided for further fabrication processes substantially as described in block 228 of FIG. 2.

Thus, the present disclosure provides a technique for forming features on a workpiece that offers relaxed overlay requirements and greater design flexibility. In some embodiments, the provided method includes receiving a workpiece having a material layer to be patterned. A first set of fins is formed on the material layer, and a second set of fins is formed on the material layer interspersed between the first set of fins. The second set of fins have a different etchant sensitivity from the first set of fins. A first etching process is performed on the first set of fins and configured to avoid substantial etching of the second set of fins. A second etching process is performed on the second set of fins and configured to avoid substantial etching of the first set of fins. The material layer is etched to transfer a pattern defined by the first etching process and the second etching process. In some such embodiments, the forming of the second set of fins includes applying a directed self assembly material to the workpiece between the first set of fins, and performing a curing process on the directed self assembly material that causes a component of the directed self assembly material to align as the second set of fins. In some such embodiments, the forming of the second set of fins further includes selectively removing another component of the directed self assembly material from between the second set of fins and the first set of fins without substantial etching of the second set of fins and the first set of fins.

In further embodiments, a method of fabrication is provided that includes receiving a substrate having a material layer disposed thereupon. A first fin material is deposited on the material layer to define a first set of fins, and a second fin material is deposited on the material layer between the first set of fins to define a second set of fins. The second fin material has a different etchant sensitivity than the first fin material. A first fin-cut process is performed on the first set of fins using an etching technique that selectively etches the first set of fins, and a second fin-cut process is performed on the second set of fins using an etching technique that selectively etches the second set of fins. A pattern is transferred to the material layer that is defined by a portion of the first set of fins remaining after the first fin-cut process and a portion of the second set of fins remaining after the second fin-cut process. In some such embodiments, a sacrificial material is formed on the material layer and patterned. To define the first set of fins, the first fin material is deposited on sidewalls of the patterned sacrificial material to define the first set of fins. The sacrificial material is removed using an etching technique configured to leave the first fin set of fins remaining on the material layer.

In yet further embodiments, a patterning method is provided that includes receiving a workpiece including a material layer. A first set of fins and a second set of fins are formed on the material layer. The fins of the second set of fins are interspersed between the fins of the first set of fins, and the fins of the first set of fins have a different etchant sensitivity from the fins of the second set of fins. A first patterning process is performed on the first set of fins to remove a subset thereof and to etch a first exposed portion of the material layer underlying the removed subset of the first set of fins. The first patterning process is configured to avoid removing an exposed portion of the second set of fins. A second patterning process is performed on the second set of fins to remove a subset thereof and to etch a second exposed portion of the material layer underlying the removed subset of the second set of fins. The second patterning process is configured to avoid removing an exposed portion of the first set of fins. In some such embodiments, the method further includes depositing a fill material on the substrate within the first etched portion of the material layer and within the second etched portion of the material layer. In some such embodiments, the material layer is selectively removed after depositing the fill material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a workpiece, the method comprising:
    receiving a workpiece having a material layer to be patterned;
    forming mandrels on the material layer;
    forming first fins on the material layer, wherein the first fins are disposed on sidewalls of the mandrels;
    after removing the mandrels, forming second fins and third fins on the material layer wherein the second fins are disposed on sidewalls of the first fins and the third fins are interspersed between the second fins, such that the third fins fill spaces between the second fins, and further wherein the first fins, the second fins, and the third fins each have a different etchant sensitivity;
    performing a first etching process on the second fins configured to avoid substantial etching of the first fins and the third fins;
    performing a second etching process on the first fins configured to avoid substantial etching of the third fins;
    performing a third etching process on the third fins configured to avoid substantial etching of the first fins; and
    etching the material layer to transfer a pattern defined by the first etching process, the second etching process, and the third etching process to the material layer.

2. The method of claim 1, wherein the forming of the second fins and the third fins includes:

applying a directed self-assembly material to the workpiece between the first fins; and performing a curing process on the directed self-assembly material that causes the directed self-assembly material to align into materials having different etch sensitivities.

3. The method of claim 1, wherein the third fins completely fill spaces between the second fins.

4. The method of claim 1,
wherein the performing of the second etching process includes patterning a resist to expose a subset of the first fins to be removed,
wherein the patterned resist exposes at least one third fin, and
wherein the second etching process is further configured such that the exposed at least one third fin remains after the second etching process.

5. The method of claim 4,
wherein the resist is a first resist,
wherein the performing of the third etching process includes patterning a second resist to expose a subset of the third fins to be removed,
wherein the patterned second resist exposes at least one first fin, and
wherein the third etching process is further configured such that the exposed at least one first fin remains after the third etching process.

6. The method of claim 1, wherein the etching the material layer to transfer the pattern includes selectively etching the material layer without substantial etching of the first fins and the third fins.

7. The method of claim 1, wherein the forming of the first fins includes:
performing a conformal deposition of a material on the mandrels and the material layer; and
performing an anisotropic etching of the material to remove a portion of the material disposed on horizontal surfaces of the mandrels and the material layer.

8. The method of claim 1, wherein the forming of the second fins includes:
performing a conformal deposition of a material on the first fins and the material layer; and
performing an anisotropic etching of the material to remove a portion of the material disposed on horizontal surfaces of the first fins and the material layer, such that the second fins include spaces defined therebetween.

9. The method of claim 8, wherein the forming of the third fins includes:
performing a conformal deposition of another material on the second fins, the first fins, and the material layer; and
performing an anisotropic etching of the another material to remove a portion of the another material disposed on horizontal surfaces of the first fins and the second fins, such that the third fins fill the spaces defined between the second fins.

10. A method of fabrication comprising:
receiving a substrate having a material layer disposed thereupon, wherein mandrels are disposed over the material layer;
depositing a first spacer material on the material layer to define a first set of fins, wherein the first set of fins are disposed on sidewalls of the mandrels;
after removing the mandrels, depositing a second spacer material and a third spacer material on the material layer between the first set of fins, wherein the third spacer material defines a second set of fins, and further wherein the first spacer material, the second spacer material, and the third spacer material are different materials;
selectively etching the second spacer material without etching the first spacer material and the third spacer material, such that the first set of fins and the second set of fins remain disposed on the material layer;
performing a first fin-cut process on the first set of fins that selectively etches the third spacer material without etching the first spacer material, such that a portion of the first set of fins remains disposed on the material layer;
performing a second fin-cut process on the second set of fins that selectively etches the first spacer material without etching the third spacer material, such that a portion of the second set of fins remains disposed on the material layer; and transferring to the material layer a pattern defined by the portion of the first set of fins remaining after the first fin-cut process and the portion of the second set of fins remaining after the second fin-cut process.

11. The method of claim 10, wherein the depositing of the second spacer material and the third spacer material includes:
depositing a directed self-assembly material on the material layer; and
curing the directed self-assembly material, such that the directed self-assembly material forms the second spacer material and the third spacer material.

12. The method of claim 10, wherein the first spacer material includes silicon nitride, the second spacer material includes amorphous silicon, and the third spacer material includes an ashing removable dielectric.

13. The method of claim 10, wherein the depositing of the first spacer material includes:
forming a sacrificial material on the material layer;
patterning the sacrificial material; and
depositing the first spacer material on sidewalls of the patterned sacrificial material to define the first set of fins.

14. The method of claim 10, wherein the performing of the first fin-cut process includes:
patterning a first resist to expose a portion of the first set of fins to be removed, wherein the patterned first resist exposes a portion of the second set of fins; and
removing the exposed portion of the first set of fins.

15. The method of claim 10, wherein the performing of the second fin-cut process includes:
patterning a second resist to expose a portion of the second set of fins to be removed, wherein the patterned second resist exposes a portion of the first set of fins; and
removing the exposed portion of the second set of fins.

16. A method comprising:
forming first fins over a material layer;
forming second fins over the material layer, wherein the second fins are disposed along sidewalls of the first fins;
forming third fins over the material layer, wherein the third fins are disposed along exposed sidewalls of the second fins;
selectively etching a subset of the first fins to expose a first portion of the material layer underlying the selectively etched subset of the first fins;
selectively etching the first portion of the material layer to form a first trench;

selectively etching a subset of the third fins to expose a second portion of the material layer underlying the selectively etched subset of the third fins;

selectively etching the second portion of the material layer to form a second trench;

forming a fill material within the first trench and the second trench; and after forming the fill material, removing the first fins remaining over the material layer, the second fins, and the third fins remaining over the material layer.

17. The method of claim 16, further comprising masking a portion of the first fins, the second fins, and the third fins before selectively etching the subset of the first fins.

18. The method of claim 16, further comprising masking a portion of the first fins, the second fins, and the third fins before selectively etching the subset of the third fins.

19. The method of claim 16, wherein the third fins completely fill spaces between a portion of the second fins.

20. The method of claim 16, further comprising removing the material layer, such that only the fill material remains over a substrate, the remaining fill material forming a pattern.

* * * * *